United States Patent [19]
Harrington

[11] Patent Number: 5,550,849
[45] Date of Patent: Aug. 27, 1996

[54] METHOD AND APPARATUS FOR DETECTING SINGLE OR MULTIPLE BIT ERRORS INSTORAGE DEVICES

[75] Inventor: Gary L. Harrington, Colorado Springs, Colo.

[73] Assignee: Ceram Incorporated

[21] Appl. No.: 64,226

[22] Filed: May 20, 1993

[51] Int. Cl.⁶ .................................................. G06F 11/10
[52] U.S. Cl. .................................... 371/37.1; 371/53
[58] Field of Search ........................ 371/37.1, 40.1, 371/40.4, 53, 41, 49.1

[56] References Cited

U.S. PATENT DOCUMENTS

| | | | |
|---|---|---|---|
| 4,317,201 | 2/1982 | Sedalis | 371/40.4 |
| 4,958,350 | 9/1990 | Worley, III et al. | 371/37.4 |
| 4,979,174 | 12/1990 | Cheng et al. | 371/41 |
| 4,993,028 | 2/1991 | Hillis | 371/39.1 |
| 5,031,181 | 7/1991 | Sako et al. | 371/41 |

*Primary Examiner*—Paul P. Gordon
*Attorney, Agent, or Firm*—Davis, Graham & Stubbs LLP

[57] ABSTRACT

A method and system for detecting and correcting all single bit errors in a data word, for detecting all 2-bit errors regardless of whether the two bits in error are consecutive, and for detecting all consecutive 3-bit and 4-bit errors regardless of whether the three bits or four bits are in a single byte. In a preferred embodiment, a set of check bits are established for the data word by exclusively ORing a set of data bits that are unique to each check bit, storing the data bits and check bits, retrieving the data bits, generating a new set of check bits from the retrieved data bits, and comparing the new set of check bits against the old set to establish a syndrome pattern which may be expressed as a hexadecimal for comparison with hexadecimals previously assigned to the data bits.

14 Claims, 2 Drawing Sheets

METHOD AND APPARATUS FOR DETECTING SINGLE OR MULTIPLE BIT ERRORS INSTORAGE DEVICES

FIELD OF THE INVENTION

The present invention relates to the field of detecting and correcting errors in the storage and transmission of binary bits in computer data storage devices. In particular, the present invention includes a method and system for detecting and correcting single-bit errors in a data word byte, for detecting two-bit errors whether or not the bits are contiguous, and for detecting three-bit and four-bit errors in contiguous bits whether or not the contiguous bits are in a single nibble.

BACKGROUND OF THE INVENTION

Digital computer devices store and transmit data in the form of bits of binary code in which each bit is typically represented in code as a "1" or "0". The devices occasionally produce an error in the storage, retrieval or transmission of data whereby a bit coded as a "1" is erroneously made a "0", or a bit coded as a "0" is erroneously made a "1".

There are many systems for detecting, and in some cases correcting, a data bit error utilizing error correction codes. The error correction codes are normally a set of parity bits that are determined by the data bits; therefore, an error in the data bits will result in a detectable change in the parity bits. The change in the parity bits indicates that an error has occurred in the data bits and, depending on the nature and extent of the error, the change in the parity bits may be analyzed to identify the error precisely. Once the error is identified precisely, it can easily be corrected; because a bit can only be "0" or a "1", an erroneous bit is corrected by simply inverting it so that a "0" becomes a "1" or a "1" becomes a "0".

In theory, any error in any combination of bits should be both detectable and correctable, but in practice the detectability and correctability of errors is limited by the extent of the parity code and the way in which the parity code is produced and manipulated. Ideally, a parity code should be simple and compact to avoid increasing the complexity or decreasing the speed of the system, and at the same time should detect and correct a high percentage of the possible errors or at least the errors most likely to occur.

Error correction codes can be categorized by the number of bits in error that can be corrected and the number of bits in error that can be detected but not corrected. The major classes of error correction codes and their acronyms are:

single bit error correcting (SEC)

single bit error correcting, double bit error detecting (SEC-DED)

single bit error correcting, double bit error detecting, single byte error detecting (SEC-DED-SBD)

single byte error correcting, double byte error detecting (SBC-DBD)

double bit error correcting, triple bit error detecting (DEC-TED)

The term "byte" as used in the names of these various categories of error correction codes does not normally have the usual meaning of 8-bits. Instead, byte refers to the width of a memory chip, which is usually 4-bits in common DRAM memories.

The reason that many error correction codes are designed to detect an error in a 4-bit byte is that such a design allows detection of an error if the error is due to a failure in an entire chip or section of chip in a memory. However, because such error correction codes are primarily to detect chip failures, they are designed to detect only those 4-bit errors that are contiguous and in the same 4-bit "nibble" of memory. Thus, they do not correct or even detect those 4-bit errors that are in non-contiguous bits or those 4-bit errors that are in contiguous bits but that span adjacent nibbles. For example, in a 32-bit memory system where the bits are numbered from the most significant to the least significant, as in 31 to 0, the 4-bit nibbles would be 31-28, 27-24, 23-20, 19-16, 15-12, 11-8, 7-4 and 3-0. A 4-bit error in contiguous bits 3, 2, 1 and 0 would be detected because those bits are in a single nibble. However, a 4-bit error in contiguors 5, 4, 3 and 2 would not be detected because some of those bits are in one nibble (the nibble of bits 7, 6, 5 and 4) while others of those bits are in a different nibble (the nibble of bits 3, 2, 1 and 0).

This requirement in normal SEC-DED-SBD error correction codes that a detectable 4-bit error be in contiguous bits in a single nibble, prevents the detection of many common errors. For example, system errors such as multiple shorted or open traces on a circuit board, a failure in memory support circuitry, and bad cables, all are capable of producing 4-bit errors in contiguous bits that span two nibbles. Thus these errors are undetectable by common SEC-DED-SBD error correction codes.

Additional background on error correction codes can be found in Worley et al. U.S. Pat. No. 4,958,350 and Hillis U.S. Pat. No. 4,993,028, and in D.C. Bossen, "b-Adjacent Error Correction," *IBM Journal of Research and Development*, Vol. 14, pp. 402–208 (July 1970); S. M. Reddy, "A Class of Linear Codes for Error Control in Byte-per-package Organized Memory Systems," *IEEE Transactions on Computers*, Vol. C-27, pp. 455–458 (May 1978); C. L. Chen, "Error Correcting Codes with Byte Error Detection Capability," *IEEE Transactions on Computers*, Vol. C-32 pp. 615–621 (July 1983); C. L. Chen, M. Y. Hsiao, "Error-Correcting Codes for Semiconductor Memory Applications: A State-of-the-Art Review," *IBM Journal of Research and Development*, Vol. 28, pp. 124–134 (March 1984).

SUMMARY OF THE INVENTION

The present invention includes a method and system for correcting and detecting errors in the storage or transmission of data bits. More particularly, in a preferred embodiment, the present invention both detects and corrects any single-bit error in a multiple-bit word of data, and detects but does not correct all 2-bit errors in the multiple-bit word of data, even if the 2-bit errors are in non-contiguous bits. The invention also detects but does not correct all 3-bit and 4-bit errors in contiguous bits even if they span two bytes. The invention also detects the error condition of all bits stuck at 1 or 0.

The preferred embodiment utilizes 24-bit words of data with check bits that are 8-bits long for a total word length of 32-bits. The 8-bits of check bits are produced from the 24-bits of data bits by means of an encoding scheme. When the 32-bit word is read, the 24-bits of data bits are used to produce another 8-bits of check bits, and those 8-bits of check bits are compared against the original 8-bits of check bits. Any discrepancies are noted and are used to produce a syndrome pattern which is translated into a hexadecimal number. Each of the 24-bits and 8 check bits of data bits has a unique associated hexadecimal number. If the hexadecimal number which was translated from the syndrome pattern matches a hexadecimal number assigned to one of the 32-data or check bits, then it is concluded that the error is in that bit. The error is corrected by inverting that bit. If the hexadecimal number which was translated from the syndrome pattern does not match any of the hexadecimal numbers assigned to the 32-data or check bits, then it is concluded that there is a 2-bit error of contiguous or non-contiguous bits or a 3-bit or 4-bit error of contiguous bits. Although such 2-bit contiguous or non-contiguous errors and 3-bit and 4-bit contiguous errors are detectable in that manner, the location of the error cannot be ascertained under the method described and so they are not correctable. It is important that 3-bit and 4-bit errors of contiguous bits are detectable, regardless of whether they all fall within a single nibble such as the typical 4-bit width of common DRAM memories; such errors are detectable even if they span two nibbles, so long as they are in contiguous bits.

The system also includes a method for checking the error condition of all-1 and all-0 bits in the 32-bit word by applying a hexadecimal value of 55 (01010101) to the bit stream before writing it into memory or transmitting it, in order to invert some bits, and then applying the same hexadecimal value after reading or receiving it in order to re-invert those bits. This ensures that for the gross error condition of all-0 or all-1 bits, the value presented to the logic operating the check bit and the syndrome pattern will not be all-0 or all-1 bits, and so such an error will not go undetected.

DETAILED DESCRIPTION OF THE INVENTION

Figure 1:
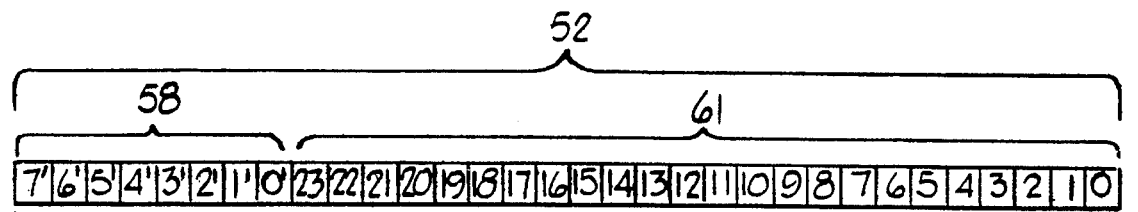
FIG. 1 is a diagrammatic view of the elements of a memory word in accordance with the present invention.

FIG. 1 shows a schematic diagram of a memory word 52 in accordance with the present invention. The memory word 52 includes a stream of check bits 58 and a stream of data bits 61. In the preferred embodiment shown, the check bits 58 are 8-bits long (bits 0' to 7') and the data bits 61 are 24-bits long (bits 0 to 23).

Figure 2:
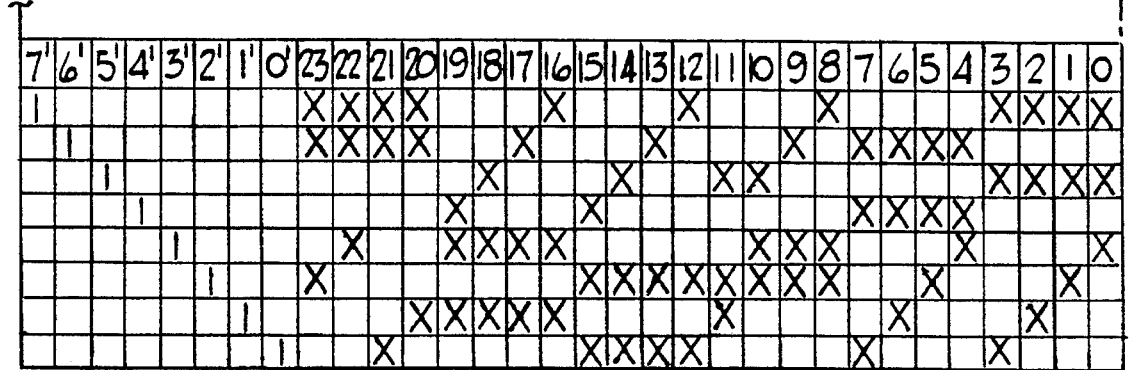
FIG. 2 is a matrix used to produce a set of check bits from a set of data bits according to the present invention.

FIG. 2 shows the system which produces the check bits 58 based on the data bits 61. A matrix 62 shows the computation of each check bit based on certain data bits that are exclusive OR'd together. For example, check bit 7' is equal to data bits 23, 22, 21, 20, 16, 12, 8, 3, 2, 1 and 0 exclusive OR'd together. Stated another way, check bit 7' is "1" if there are an odd number of "1"s in data bits 23, 22, 21, 20, 16, 12, 8, 3, 2, 1 and 0, and check bit 7' is "0" if there are an even number of "1"s in those data bits. A similar process applies for the other check bits 0' through 6' according to the matrix of FIG. 2: check bit 6' is "1" if there are an odd number of "1"s in data bits 23, 22, 21, 20, 17, 13, 9, 7, 6, 5 and 4, and is "0" if there are an even number of "1"s in those data bits; check bit 5' is "1" if there are an odd number of "1"s in data bits 18, 14, 11, 10, 3, 2, 1 and 0, and is "0" if there are an odd number of "1"s in those data bits; check bit 4' is "1" if there are an odd number of "1"s in data bits 19, 15, 7, 6, 5 and 4, and is "0" if there are an even number of "1"s in those data bits; check bit 3' is "1" if there are an odd number of "1"s in data bits 22, 19, 18, 17, 16, 10, 9, 8, 4 and 0, and is "0" if there are an even number of "1"s in those data bits; check bit 2' is "1" if there are an odd number of "1"s in data bits 23, 15, 14, 13, 12, 11, 10, 9, 8, 5 and 1, and is "0" if there are an even number of "1"s in those data bits; check bit 1 is "1" if there are an odd number of "1"s in data bits 20, 19, 18, 17, 16, 11, 6 and 2, and is "0" if there are an even number of "1"s in those data bits; and check bit 0' is "1" if there are an odd number of "1"s in data bits 21, 15, 14, 13, 12, 7 and 3, and is "0" if there are an even number of "1"s in those data bits.

Figure 3:
FIG. 3 is a diagrammatic view of a set of data bits used as an example herein.
Figure 4:
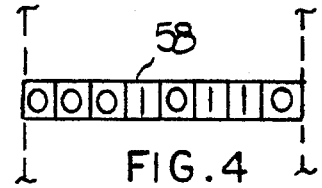
FIG. 4 is a diagrammatic view of a set of check bits generated from the data bits of FIG. 3 in an example herein.

FIG. 3 shows an example data bit stream 61 which consists of the bit stream "001101000101101001001110". The check bits 58 are generated from the example data bit stream 61 by application of the matrix 62 of FIG. 2 to the data bit stream 61 of FIG. 3. For example, check bit 7' is determined by comparing the data stream 61 against the first row under the heading of the matrix 62 to produce the check bits 58 of FIG. 4. The data bit stream 61 does include a "1" in some of data bits 23, 22, 21, 20, 16, 12, 8, 3, 2, 1 or 0. Specifically the data bit stream 61 includes a "1" in data bits 21, 20, 12, 3, 2 and 1. On this basis, check bit 7' would be made "0" since there are 6 data bits having a "1" out of the eleven possible data bits relevant to check bit 7', and six is an even number. A similar process of applying the matrix 62 of FIG. 2 to the example data bit stream of FIG. 3 to generate the check bits 58 of FIG. 4 is used for check bits 6' through 0'. For check bit 6', the data bit stream includes a "1" in four of data bits 23, 22, 21, 20, 17, 13, 9, 7, 6, 5 and 4 which are relevant to check bit 6' (specifically, the data bit stream includes a "1" in data bits 21, 20, 9 and 6). Because four is an even number, check bit 6' is made "0". For check bit 5', the data bit stream includes a "1" in six of data bits 18, 14, 11, 10, 3, 2, 1 and 0 which are relevant to check bit 5' (specifically, the data stream includes a "1" in data bits 18, 14, 11, 3, 2 and 1) and so check bit 5' is made a "0" since six is an even number. For check bit 4', the data bit stream includes a "1" in one of data bits 19, 15, 7, 6, 5 and 4 which are relevant to check bit 4' (specifically, the data stream includes a "1" in data bit 6) and so check bit 4' is made a "1" since one is an odd number. For check bit 3', the data bit stream includes a "1" in two of data bits 22, 19, 18, 17, 16, 10, 9, 8, 4 and 0 which are relevant to check bit 3' (specifically, the data bit stream includes a "1" in data bits 18 and 9) and so check bit 3' is made a "0" since two is an even number. For check bit 2', the data bit stream includes a "1" in five of data bits 23, 15, 14, 13, 12, 11, 10, 9, 8, 5 and 1 which are relevant to check bit 2' (specifically, the data bit stream includes a "1" in data bits 14, 12, 11, 9 and 1) and so check bit 2' is made a "1" since five is an odd number. For check bit 1', the data bit stream includes a "1" in five of data bits 20, 19, 18, 17, 16, 11, 6 and 2 (specifically, the data bit stream includes a "1" in data bits 20, 18, 11, 6 and 2) and so check bit 1' is made a "1" since five is an odd number. Finally, for check bit 0', the data bit stream includes a "1" in four of data bits 21, 15, 14, 13, 12, 7 and 3 which are relevant to check bit 0' (specifically, the data bit stream includes a "1" in data bits 21, 14, 12, and 3) and so check bit 0' is made a "0" since four is an even number.

Thus, there are an odd number of matches in the matrix 62 for check bits 4', 2' and 1', and there are an even number of matches in the matrix 62 for check bits 7', 6', 5', 3' and 0'. Therefore, check bits 4', 2' and 1' are made "1" and check bits 7', 6', 5', 3' and 0' are made "0". The resulting set of check bits from 7' to 0' is 00010110.

The detection and correction of a single bit error in the data bits 61 can be illustrated by changing one of the data bits to simulate an error. For example, if the "1" in data bit 20 is changed to a "0" as in FIG. 5, it can be appreciated from reviewing the matrix 62 that there is an effect on check bits 7', 6' and 1'. While previously the "1" in data bit 20 produced matches in the matrix for each of those check bits, now that the "1" in check bit 20 is changed to "0" there is one fewer match for each of those check bits. This causes the even number of matches from check bits 7' and 6' to change to an odd number and so the "0" that was formerly in each of those check bits is now a "1", and it causes the odd number of matches for check bit 1' to change to an even number so that the "1" that was formerly in that check bit is now a "0". This results in check bits 7' through 0' reading 11010100 as shown in FIG. 6.

When the 32-bit memory word is retrieved from memory, and a new 8-bit list of check bits is generated from the 24-bit data bits, the new check bits are compared against the old check bits. Upon making that comparison, it is apparent that check bits 7', 6' and 1' in the new check bits do not match the same check bits in the old check bits. By reference to the matrix 62, it can be determined that this mismatch corresponds to a change in data bit 20. Therefore, the value of "0" in data bit 20 is assumed to be in error, and so the "0" is inverted to become a "1" to correct the error.

Figure 7:
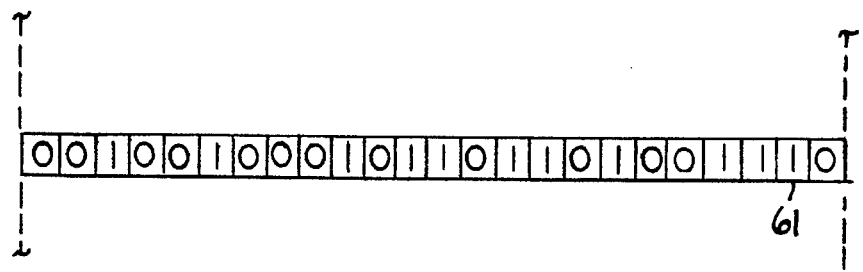
FIG. 7 is a hexadecimal syndrome pattern table correlating hexadecimal syndrome patterns with single bit errors in accordance with the present invention.

The error can also be identified and corrected by reference to the hexadecimal system in FIG. 7 rather than by reference to the matrix 62. If the old check bits from 7' to 0' (0010110) are compared against the new check bits from 7' to 0' (11010100) a syndrome pattern can be generated in which "0" represents matching check bits between the old check bits and new check bits and "1" represents unmatching check bits between the old check bits and new check bits. In the present example, this comparison produces the syndrome pattern of 11000010. This value can be reduced to a hexadecimal expression of C2. (The first four bits of the syndrome pattern add up to 1 times $2^3$, plus 1 times $2^2$, plus 0 times $2^1$, plus 0 times $2^0$, which equals 12; and the second four bits of the syndrome pattern add up to 0 times $2^3$, plus 0 times $2^2$, plus 1 times $2^1$, plus 0 times $2^0$, which equals 2. Twelve translates to "C" in hexadecimal while 2 translates into "2" in hexadecimal, for a hexadecimal expression of C2.

Each data bit and check bit has an associated hexadecimal expression as shown in the table 70 of FIG. 7. The data bit or check bit that is in error is identified by locating the hexadecimal syndrome pattern in the table. In the present example, it is seen that the hexadecimal syndrome pattern C2 corresponds to data bit 20. Therefore, it is concluded that the "0" in bit 20 is in error, and the error is corrected by inverting the "0" to become a "1".

Because the check bits have unique hexadecimals assigned to them as well as the data bits, a single bit error in the check bits can also be detected and corrected. This would be desirable when, for example, one wants to pass the entire memory word along to the next circuit so that error checking can also be done at the next destination.

If the hexadecimal syndrome pattern is not in the table of FIG. 7, then it is concluded that there is an error but the error is not identifiable or correctable. Further examples will illustrate the generation of a syndrome pattern which is not in table 70 of FIG. 7 and therefore represents an error which is detectable but not identifiable or correctable.

Figure 5:
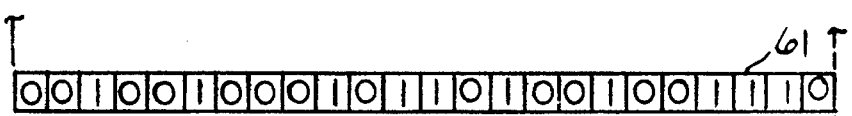
FIG. 5 is a diagrammatic view of a set of data bits used as another example herein.
Figure 6:
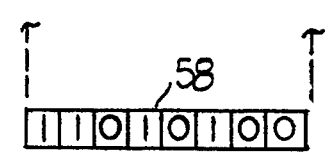
FIG. 6 is a diagrammatic view of a set of check bits generated from the data bits of FIG. 5 in an example herein.
Figure 8:
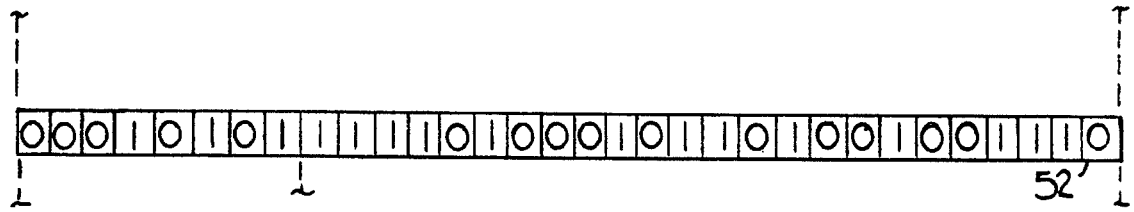
FIG. 8 is a diagrammatic view of a set of data bits used as another example herein.

If data bit 8 from the data bits of FIG. 5 is changed from "0" to "1", then the resulting data bits are as shown in FIG. 8. Because the data bits of FIG. 5 represented a single bit error from the data bits of FIG. 3, this additional change represents a two bit error from the data bits of FIG. 3; both data bit 20 and data bit 8 are changed from FIG. 3 to FIG. 8.

It can be appreciated by reference to the matrix 62 of FIG. 2 that the change in data bit 20 from FIGS. 3 to FIG. 8 affects check bits 7', 6' and 1', and that the change in data bit 8 from FIG. 3 to FIG. 8 affects check bits 7', 3' and 2'. Therefore, check bit 7' is affected twice; there is one less match at data bit 20 from "1" to "0", but there is one more match at data bit 8 due to the change in data bit 8 from "0" to "1". The net effect is that there are still an even number (six) of matches for check bit 7' in the matrix 62, and so check bit 7' remains a "0" as it was in FIG. 4. For check bits 6' and 1', and 3' and 2', there is a single change; therefore, each of those check bits are inverted from the list shown in FIG. 4. The resulting check bits 58 are 01011000 as shown in FIG. 9.

Figure 9:
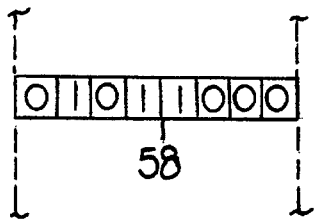
FIG. 9 is a diagrammatic view of a set of check bits generated from the data bits of FIG. 8 as an example herein.

A comparison of the new check bits of FIG. 9 generated by the new data bits of FIG. 8, with the old check bits of FIG. 4 generated by the old data bits of FIG. 3, shows that there has been a change in check bits 6', 3', 2' and 1'. A review of matrix 62 shows that there is no single bit error that affects check bits 6', 3', 2' and 1'; therefore, it is concluded that there is an error but the error is not identifiable or correctable.

Alternatively, the comparison of the new check bits of FIG. 9 generated by the new data bits of FIG. 8, with the old check bits of FIG. 4 generated by the old data bits of FIG. 3, can be used to produce a hexadecimal syndrome pattern. The change in check bits 6', 3', 2' and 1' results in a syndrome pattern of 01001110. Expressed as a hexadecimal, this syndrome pattern is 4E. (The first four bits are 0 times $2^3$, plus 1 times $2^2$, plus 0 times $2^1$, plus 0 times $2^0$, which equals 4, while the second four bits translate to 1 times $2^3$, plus 1 times $2^2$, plus 1 times $2^1$, plus 0 times $2^0$, which equals 14. The 4 for the first four bits translates to "4" in hexadecimals and the 14 for the second four bits translates to "E".) A review of table 70 of FIG. 7 shows there is no entry for 4E. Thus it is concluded that there is an error but the error is not a single bit error that can be identified and corrected.

Figure 10:
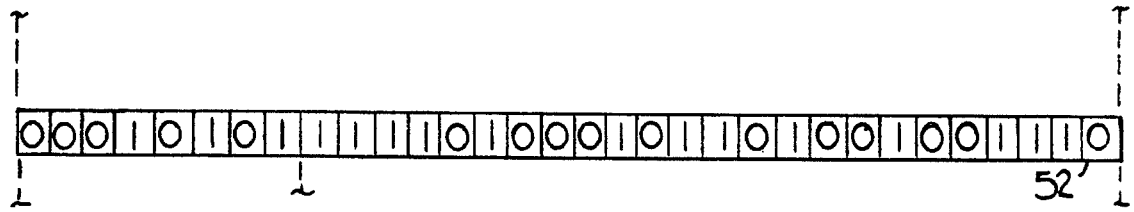
FIG. 10 is a diagrammatic view of a memory word used as another example herein.

Another example will illustrate the generation of a syndrome pattern by an error in four contiguous data bits that are not in a single 4-bit nibble. In FIG. 10, check bits 1' and 0' and data bits 23 and 22 are inverted as compared to FIG. 3 and FIG. 4. This will generate the new check bits of FIG.

Figure 10A:
FIG. 10A is a diagrammatic view of a set of check bits generated from FIG. 10 as an example herein.

10A. When the received check bits of FIG. 10 are exclusive OR'd with the new check bits of FIG. 10A, a syndrome pattern of 00001111 results:

| syndrome bit | number of effects | change |
| --- | --- | --- |
| 7' | 2 | none |
| 6' | 2 | none |
| 5' | 0 | none |
| 4' | 0 | none |
| 3' | 1 | invert |
| 2' | 1 | invert |
| 1' | 1 | invert |
| 0' | 1 | invert |

A review of matrix 62 from FIG. 2 shows that no single bit error affects check bits 3', 2', 1' and 0'. Therefore, it is concluded that there is an error, but the error is not a single-bit error that can be identified and corrected.

This syndrome pattern of 00001111 translates into a hexadecimal expression of 0F. A review of the syndrome pattern table 70 from FIG. 7 shows no entry for hexadecimal 0F, which confirms that an error occurred but the error is not an identifiable and correctable single bit error. It is important to note that the present system, unlike others in the art, detects a contiguous 4-bit error such as the one in this example even though the four contiguous bits in which the error occurred are not in a single 4-bit nibble but instead span two different 4-bit nibbles.

Figure 11:
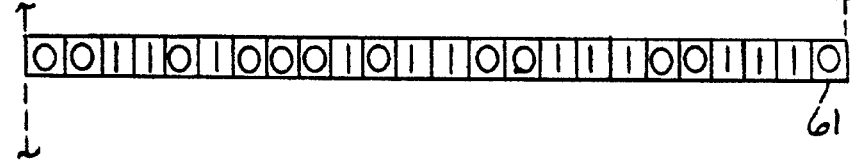
FIG. 11 is a diagrammatic view of a set of data bits used as another example herein.

The final example shows the detection of an error in three contiguous bits which span two 4-bit nibbles. FIG. 11 shows the same data bits as in FIG. 3, but with data bits 9, 8 and 7 inverted. As indicated by matrix 62 of FIG. 2, this change results in the following changes to the check bits:

| check bit | number of effects | change |
| --- | --- | --- |
| 7' | 1 | invert |
| 6' | 2 | none |
| 5' | 0 | none |
| 4' | 1 | invert |
| 3' | 2 | none |
| 2' | 2 | none |
| 1' | 0 | none |
| 0' | 1 | invert |

It is seen from this table that the inverted check bits are check bits 7', 4' and 0'. Matrix 62 of FIG. 2 shows that there is no single bit error that inverts check bits 7', 4' and 0'. Therefore, it is concluded that there is an error but it is not a single bit error that is identifiable and correctable.

Figure 12:
FIG. 12 is a diagrammatic view of a set of check bits generated from the data bits of FIG. 11 as an example herein.

The same results are obtained by expressing the changed bits as a hexadecimal syndrome pattern. The check bits for the data bits of FIG. 11 are 10000111. The syndrome pattern for changed check bits 7', 4' and 0', which may be obtained by comparing the check bits of FIG. 12 against the check bits of FIG. 4, is 10010001. This syndrome pattern is expressed as the hexadecimal 91. (The first four bits are 1 times $2^3$, plus 0 times $2^2$, plus 0 times $2^1$ plus 1 times $3^1$, which equals "9", while the second four bits are 0 times $2^3$, plus 0 times $2^2$, plus 0 times $2^1$, plus 1 times $2^0$, which equals 1. Expressed as a hexadecimal, this is 91.) A review of the table 70 of FIG. 7 shows no entry for 91. Therefore, it is confirmed that there is an error but the error is not an identifiable and correctable single-bit error.

The system may also include a step to detect the error condition of all "0" and all "1" bits. The data bits and computed check bits are exclusively OR'd with the hexa- decimal value of 55 which corresponds to a bit stream of 01010101, before the 32-bit memory word is written into memory. After reading back the 32-bit memory word, the check bits are again exclusively OR'd with the hexadecimal of 55. This assures that for the gross error condition of all "0" or all "1" bits, the value presented to the check bit generation logic and the syndrome computation logic will never be all "0" or all "1" and therefore will not go undetected.

What is claimed is:

1. A method for detecting multiple bit errors in binary coded information, comprising the steps of:

receiving a plurality of binary coded data bits; generating a first plurality of binary coded check bits based on said received data bits, wherein each of said plurality of check bits is generated by a unique set of data bits, the data bits and check bits together being a set of memory bits; storing said memory bits; retrieving said memory bits; generating a second plurality of check bits based on said retrieved memory bits; comparing the first plurality of check bits to the second plurality of check bits to determine any differences between the first plurality of check bits and the second plurality of check bits; and using said determination of differences to establish the existence of any single bit and multiple bit errors, whether or not they are in the same byte, in the data bits, check bits and both, and to determine which of the data bits or check bits contains said error.

2. The method of claim 1, wherein the data bits are arranged consecutively in a data word and the check bits are arranged consecutively in a check bit word, and the data word in combination with the check bit word constitutes a memory word, and further comprising using said determination of differences to establish the existence of any 2-bit errors in the memory word, whether or not the 2-bit errors are contiguous.

3. The method of claim 2, wherein said data bits and check bits are stored in a memory having a width capable of storing a number of bits, and wherein said memory word includes a plurality of consecutive bytes, each byte containing a number of consecutive bits equal to the width of the memory.

4. The method of claim 3, wherein each byte contains four consecutive bits.

5. The method of claim 4, further comprising using said determination of differences to establish the existence of any 3-bit error in three consecutive bits in the memory word, regardless of whether said 3-bit errors are in a single byte.

6. The method of claim 5, further comprising using said determination of differences to establish the existence of any 4-bit error in four consecutive bits in the memory word, regardless of whether said 4-bit errors are in a single byte.

7. The method of claim 6, wherein each check bit is established by exclusively ORing a set of data bits that is unique to that check bit.

8. The method of claim 7, wherein the data word is six bytes long and the check bit word is two bytes long, and each byte is 4-bits long, so that the data word is 24 bits long and the check bit word is eight bits long.

9. The method of claim 8, wherein each data bit is exclusively OR'd with three check bits.

10. The method of claim 7, wherein said determination of differences is expressed as a hexadecimal.

11. The method of claim 10, wherein each data bit and check bit is assigned a unique hexadecimal, so that a determination of differences expressed as a hexadecimal number which matches a hexadecimal number assigned to a data bit or check bit, is indicative of a single bit error in that data bit or check bit.

12. The method of claim 11 wherein a determination of differences expressed as a hexadecimal number which does not match any hexadecimal number assigned to a data bit or check bit, is indicative of at least one of a 2-bit error regardless of whether the two bits in error are consecutive, a 3-bit error in three consecutive bits regardless of whether the three consecutive bits are contained in a single byte, and a 4-bit error in four consecutive bits regardless of whether the four consecutive bits are contained in a single byte.

13. The method of claim 6, further comprising exclusively ORing the memory bits with a hexadecimal number representing alternating ones and zeros prior to storing the memory bits so that the bits in the stored memory word are not all the same.

14. The method of claim 13, further comprising exclusively ORing the bits retrieved from the memory with said hexadecimal number.

* * * * *